United States Patent [19]
Schorn

[11] Patent Number: 5,838,170
[45] Date of Patent: Nov. 17, 1998

[54] PMOS CHARGE-SHARING PREVENTION DEVICE FOR DYNAMIC LOGIC CIRCUITS

[75] Inventor: Eric Bernard Schorn, Austin, Tex.

[73] Assignee: International Business Machines Corporation, Armonk, N.Y.

[21] Appl. No.: 713,883

[22] Filed: Sep. 17, 1996

[51] Int. Cl.$^6$ ..................... H03K 19/096; H03K 19/084
[52] U.S. Cl. ............................. 326/98; 326/95; 326/106
[58] Field of Search ............................ 326/93, 95, 98, 326/106

[56] References Cited

U.S. PATENT DOCUMENTS

| | | | |
|---|---|---|---|
| 4,780,626 | 10/1988 | Guerin et al. | 326/98 |
| 4,797,580 | 1/1989 | Sunter | 326/98 |
| 4,849,658 | 7/1989 | Iwamura et al. | 326/98 |
| 4,899,066 | 2/1990 | Aikawa et al. | 326/98 |
| 5,065,048 | 11/1991 | Asai et al. | 326/98 |
| 5,146,115 | 9/1992 | Benhamida | 326/95 |
| 5,661,675 | 8/1997 | Chin et al. | 326/95 |

Primary Examiner—Michael J. Tokar
Assistant Examiner—Richard Roseen
Attorney, Agent, or Firm—Anthony V. S. England; Andrew J. Dillon

[57] ABSTRACT

A logic block comprised of several transistors is provided. The logic block has several inputs and an output for communicating the result of its logic operation. A precharge device having a clock input is connected to the output of the logic block. The precharge device periodically allows the output of the logic block to become valid. This is accomplished by holding the output of the logic block at a fixed voltage level when the clock input is at a first voltage level, and when the clock input changes to a second voltage level, the precharge device allows the result of the logic function performed by the logic block to appear at the output of the logic block. Also, a charge redistribution prevention device is connected to at least one of the transistors included in the logic block. The charge redistribution prevention device prevents charge redistribution by applying a voltage to at least one of the transistors in the logic block. Applying a voltage in this manner equalizes the difference in voltage between internal nodes of the logic block and the output of the logic block, thereby preventing charge from redistributed.

6 Claims, 3 Drawing Sheets

5,838,170

PMOS CHARGE-SHARING PREVENTION DEVICE FOR DYNAMIC LOGIC CIRCUITS

BACKGROUND OF THE INVENTION

1. Technical Field

This invention relates generally to dynamic logic circuits, and, more specifically, it relates to the prevention of charge sharing between dynamic nodes in a dynamic logic circuit.

2. Description of the Related Art

Dynamic CMOS logic circuits are used in many varied digital applications. Such circuits are especially common in modern microprocessors and micro-controllers. In general, these circuits perform adequately, but problems still exist in these dynamic CMOS logic circuits.

One problem which is common to almost all dynamic logic circuits is charge redistribution. Charge redistribution (a.k.a charge sharing) occurs when the transistors which comprise the logic portion of a CMOS logic circuit become conducting. When these transistors become conducting, a small, but significant, current can flow from nodes which control the output of the logic circuit through the newly conducting transistors in the logic portion of the device. This current flows in an attempt to equalize the potential of all the nodes which have been put into electrical contact by the switching of the logic transistors. This sudden redistribution of charge may cause the voltage on the line which controls the output of the logic circuit to drop to a level which causes the output of the logic circuit to switch to an incorrect state.

What is needed is a device which prevents this sudden redistribution of charge, thereby preventing the output of the logic circuit from incorrectly changing states.

SUMMARY OF THE INVENTION

Therefore, it is one objective of the present invention to provide a device which prevents charge redistribution in a dynamic CMOS logic circuit from causing the output of the dynamic logic circuit to switch to an incorrect state.

It is another objective of the present invention to provide a device which consumes only minimal surface area, and which is easy to fabricate and manufacture.

These and other objectives are achieved as follows. A logic block comprised of several transistors is provided. The logic block has several inputs and an output for communicating the result of its logic operation. A precharge device having a clock input is connected to the output of the logic block. The precharge device periodically allows the output of the logic block to become valid. This is accomplished by holding the output of the logic block at a fixed voltage level when the clock input is at a first voltage level; and when the clock input changes to a second voltage level, the precharge device allows the result of the logic function performed by the logic block to appear at the output of the logic block.

In addition, a charge redistribution prevention device is connected to at least one of the transistors included in the logic block. The charge redistribution prevention device prevents charge redistribution by applying a voltage to at least one of the transistors in the logic block. Applying a voltage in this manner reduces the voltage difference between internal nodes of the logic block and the output of the logic block, thereby preventing charge from being redistributed.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

This application is related to the application entitled "NMOS Charge-Sharing Prevention Device For Dynamic Logic Circuits," having the same filing date as this application and being further identified by the Attorney Docket Number AT9-96-034.

Figure 1:
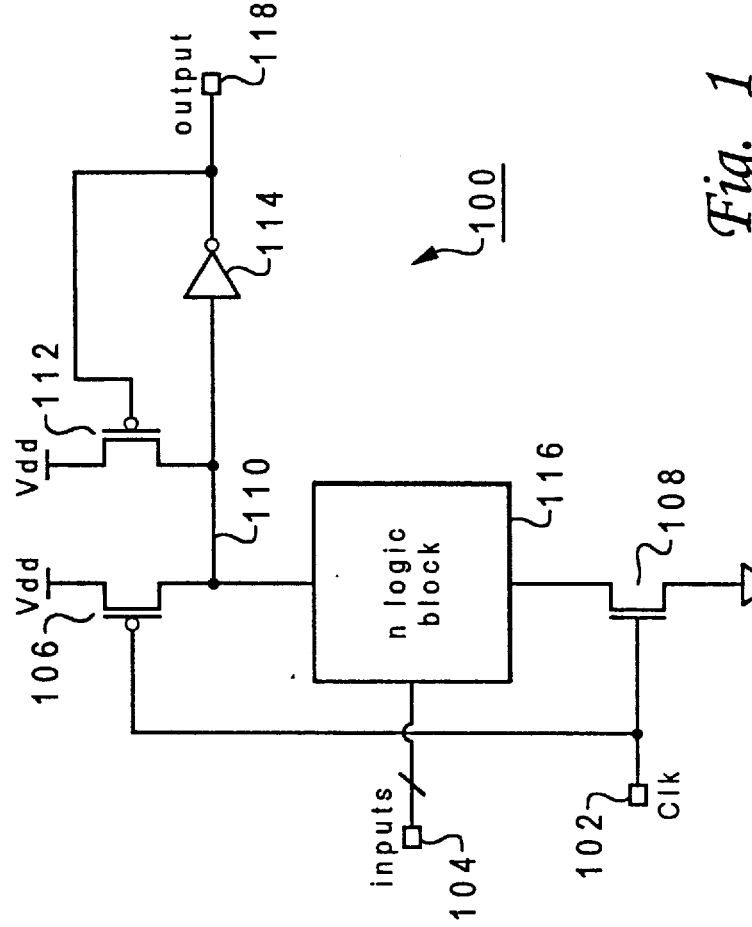
FIG. 1 illustrates a prior art dynamic CMOS logic circuit.

FIG. 1 illustrates prior art dynamic CMOS logic circuit 100. Initially, when the signal on clock line 102 is low, transistor 106 precharges node 110 to $V_{dd}$. Since node 110 is charged to $V_{dd}$, output node 118 will be low.

When the signal on clock line 102 transitions to a high state, transistor 106 will become non-conducting and transistor 108 will become conducting. During the time when the clock signal is high, input lines 104 will be evaluated by the logic in logic block 116. To keep the voltage at node 110 set at $V_{dd}$, transistor 112 remains conducting until the voltage at output 118 becomes high. Transistor 112 is a weak device, as it must be able to be pulled down by transistor 108 and the transistors within logic block 116.

Charge sharing can occur in the circuit shown in FIG. 1 if a transistor in logic block 116, which is also connected to node 110, becomes conducting. If such a transistor becomes conducting while the signal on clock line 102 is high, the voltage at node 110 can temporarily drop to a level that causes the output of inverter 114 to switch from low to high.

Such an occurrence will not cause problems if the transistors in logic block 116 ultimately evaluate in such a way that node 110 becomes electrically connected to ground through transistor 108. In such a case, the voltage at node 110 will be pulled down to a low level, thus causing the output of inverter 114 to become high. The final result will be that node 110 is set to a low level and the output node 118 will be high during the time period when the signal on clock line 102 is high.

However, if only some of the transistors within logic block 116 (including a transistor which is attached to node 110) become conducting without a path from node 110 to ground through transistor 108 ultimately being formed, charge sharing from node 110 to the transistors within logic block 116 can create a false output. As stated above, charge sharing occurs when some of the charge on node 110 is distributed to the nodes within logic block 116 when at least one transistor which is attached to node 110 becomes conducting. This can cause the voltage at node 110 to drop to a level which triggers inverter 114 to change its output from low to high.

Figure 2:
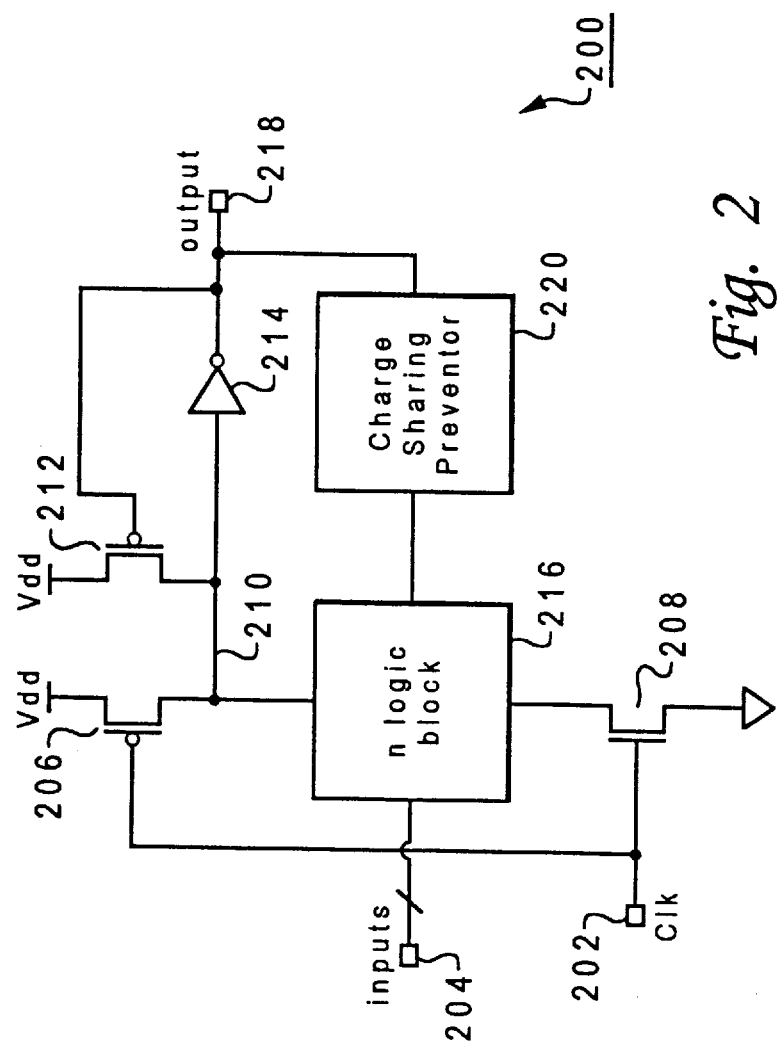
FIG. 2 illustrates a dynamic CMOS logic circuit according to the present invention.

FIG. 2 illustrates dynamic CMOS logic circuit 200, which includes the present invention. CMOS logic circuit 200 is similar to CMOS logic circuit 100 shown in FIG. 1. However, in CMOS logic circuit 200, charge sharing preventor circuit 220 has been added to prevent charge from being distributed from node 210 to nodes internal to logic block 216. Charge sharing preventor 220 prevents charge from being distributed by charging selected nodes within logic block 216 to a voltage level of $V_{dd}$ (where $V_{dd}$ is the power supply voltage). Typically, for NMOS transistors located within logic block 216 who have their drain connected to node 210, charge sharing preventor 220 will be connected to the source terminal of these devices.

In such an arrangement, when a transistor in logic block 216 whose drain is connected to node 220 becomes conducting, there will not be a sudden rush of current through this transistor since the source terminal of this device is being held at a voltage roughly approximate to that found on the drain terminal which is connected to node 210. Thus, charge sharing preventor 220 prevents charge sharing between node 210 and logic block 216 by insuring that transistors which are connected to node 210 have a roughly equal charge on both their source and drain terminals.

Figure 3:
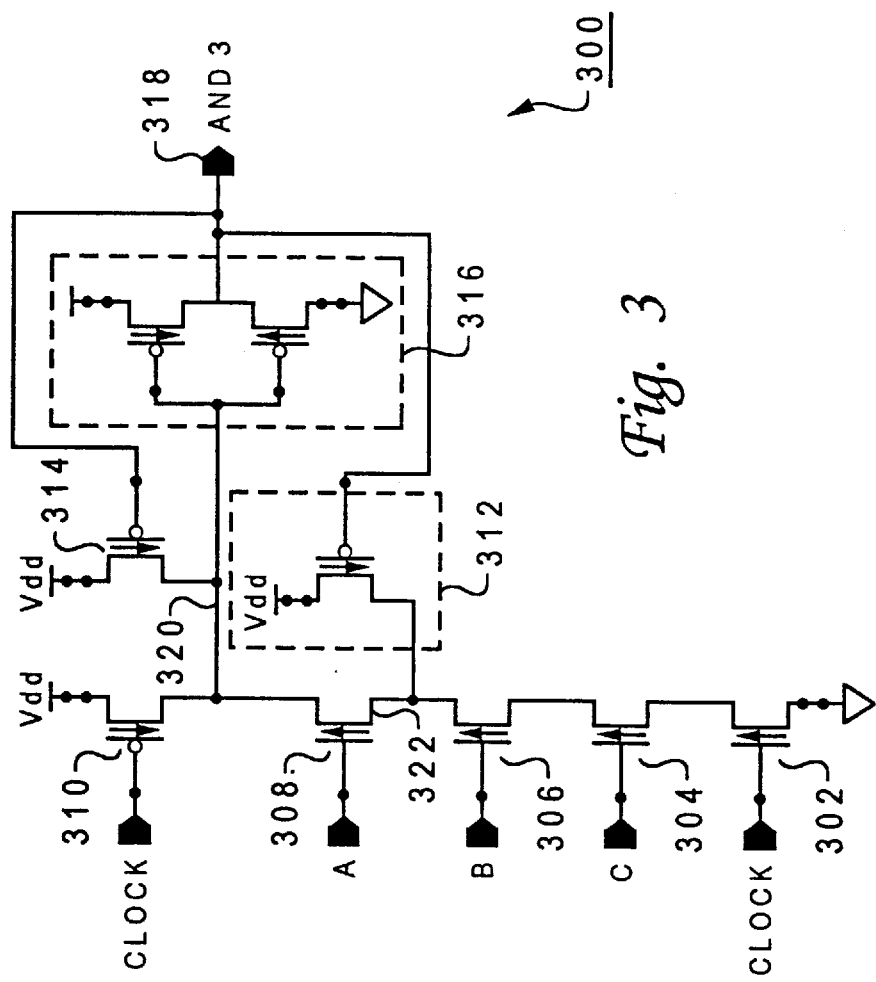
FIG. 3 depicts a more detailed example of a dynamic CMOS logic circuit according to the present invention.

FIG. 3 illustrates one example of how charge sharing preventor 220, shown in FIG. 2, may be implemented in a dynamic CMOS logic circuit. Transistors 304, 306 and 308 comprise a three-input AND logic block, with lines A, B and C as inputs. When lines A, B, and C are evaluated by transistors 304, 306 and 308, the result is seen at output node 318. The clock signal controls the switching of transistors 310 and 302, and allows inputs A, B and C to be evaluated when the clock signal is high. Transistor 314 keeps node 320 pulled high while the clock signal is high unless transistors 304, 306 and 308 all become conducting. In this case, node 320 will become low and the output at output node 318 will switch transistor 314 to a non-conducting state.

In addition to the above-described components in FIG. 3, charge sharing preventor circuit 312 is provided. The PMOS transistor which comprises circuit 312 prevents charge sharing from occurring between node 320 and node 322. When the clock signal transitions from a low to a high state, the PMOS transistor in circuit 312 has charged node 322 to a voltage of $V_{dd}$. If input A were to become high while the clock signal was high, transistor 308 would become conducting. If node 322 had not been charged to $V_{dd}$ and the existing voltage level at node 322 was relatively low, the charge that had accumulated on node 320 would flow through transistor 308 to node 322. This redistribution of charge from node 320 to node 322 could temporarily lessen the voltage at node 322 (until transistor 314 can raise the voltage level again). If the voltage swing at node 322 is great enough, inverter 316 may incorrectly switch its output from low to high.

However, in CMOS logic circuit 300, node 322 has been charged to a voltage of approximately $V_{dd}$. If transistor 308 were to become conducting, very little current would flow from node 320 to node 322. Since only a minimal amount of current would flow through transistor 308, there would be little, if any, appreciable voltage drop at node 320 when transistor 308 switched to the conducting state. This would ensure that inverter 316 would not see a low signal at node 320 and switch its output from low to high, solely by the switching of transistor 308.

The PMOS transistor in circuit 312, like transistor 314, is a weak device. The combined efforts of circuit 312 and transistor 314 to keep nodes 320 and 322 at a high voltage level must be able to be quickly overcome by transistors' 302–308 efforts to pull node 320 to a low level. Typically, the W/L ratio of transistors 302–308 is significantly greater than the W/L ratio of the PMOS transistor in circuit 312.

The addition of circuit 312 in the manner shown in CMOS logic circuit 300 provides several advantages over other efforts to remedy the effect of charge sharing. By applying a voltage equal to $V_{dd}$ to node 320, the PMOS transistor in circuit 312 provides for more charge sharing prevention than other circuits which apply lower voltages to node 320. In addition, the gate of the PMOS transistor in circuit 312 is connected to the output of inverter 316. This provides the gate of the PMOS transistor with a stable voltage source. In contrast, some other charge sharing prevention circuits are controlled by the voltage level at node 320, where the voltage level can vary due to the switching of the various transistors connected to node 320. Being controlled by a stable voltage source makes circuit 312 more robust and less likely to incorrectly change state. In addition, using the PMOS transistor in circuit 312 to apply $V_{dd}$ to node 320 is a standard use of a PMOS transistor, and, consequently, the behavior circuit 312 in FIG. 3 is very predictable. Also, in modeling transistors for circuit analysis programs, PMOS transistors (rather than NMOS transistors), are typical in applications where a transistor is connected to $V_{dd}$. Charge sharing preventor circuit 312 of FIG. 3 likewise uses a PMOS transistor connected to $V_{dd}$ and therefore the behavior of circuit 312 should closely conform to behavior predicted by such circuit analysis programs.

Also, the inclusion of circuit 312 requires very little surface area. Further, circuit 312 dissipates no DC power for most input patterns. In addition, circuit 312 is not dependant upon the particular input pattern of input lines A, B, and C, nor does it place a load on either the clock signal or the input signals. Circuit 312 provides continuous protection against charge leaking (e.g., during long burn-in evaluations). Circuit 312 does not require global signals, such as an inverted clock, as it uses only local signals. Finally, in some instances, circuit 312 can improve the input noise margin.

While circuit 312 is shown in FIG. 3 to be used in a three-input AND logic block, it could also be used to prevent charge sharing in any number of logic block configurations. For instance, additional transistors could be added to circuit 312 to precharge other internal nodes of the logic block to further prevent charge sharing. Also, if the AND logic block was a multiple input OR logic block, additional transistors might be needed to be connected to several internal nodes to adequately prevent charge sharing.

While the invention has been particularly shown and described with reference to a preferred embodiment, it will be understood by those skilled in the art that various changes in form and detail may be made therein without departing from the spirit and scope of the invention.

I claim:

1. A device for preventing charge redistribution in a Logic circuit, comprising:

a logic block having a plurality of inputs and an output, the logic block including a plurality of transistors;

a precharge device, being connected to the output of the logic block, wherein the precharge device is a clock application device having a clock input which alternates between a first voltage level and a second voltage level and wherein said Precharged device holds the output of the logic block at a fixed voltage level during a first period of time, when said clock input is at a first voltage level, and wherein the precharge device allows a result of a logic operation performed within the logic block to be communicated at the output of the logic block during a second period of time;

an inverting stage having an input connected to the output of the logic block, and having an output;

a charge redistribution prevention device connected to at least one of the transistors in the logic block and controlled by the output of the inverting stage for applying a voltage to the logic block to reduce charge flowing from the output of the logic block to nodes internal to the logic block when the at least one transistor in the logic block becomes conducting;

a bias device, connected to the output of the logic block and controlled by the output of the inverting stage, for maintaining the output of the logic block at a constant voltage when the clock input is at the second voltage level, until this output of the logic block changes to a different voltage level.

2. The device as described in claim 1, wherein the plurality of transistors within said logic block comprise a plurality of NMOS transistors.

3. The device as described in claim 1, wherein the output of the logic block is a drain portion of a particular NMOS transistor, and the charge redistribution prevention device is connected to a source portion of the particular NMOS transistor.

4. The device as described in claim 1, wherein the charge redistribution prevention device comprises a PMOS transistor with a source region connected to a voltage supply, a drain region connected to a source region of a NMOS transsitor within the logic block, and a gate region connected to the output of the inverting stage.

5. The device as described in claim 1, wherein the charge redistribution prevention mechanism comprises a PMOS transistor with a W/L ratio significally less than transistors included in the logic block.

6. The device as described in claim 1, wherein the logic block is a three input AND structure comprised of three NMOS transistor connected in series.

* * * * *